(12) United States Patent
Das et al.

(10) Patent No.: US 9,520,881 B1
(45) Date of Patent: Dec. 13, 2016

(54) SYSTEMS AND METHODS FOR TUNING AN OSCILLATOR FREQUENCY

(71) Applicant: TEXAS INSTRUMENTS INCORPORATED, Dallas, TX (US)

(72) Inventors: Abhijit Kumar Das, Plano, TX (US); Krishnasawamy Nagaraj, Plano, TX (US); Rahul Bhandarkar, Austin, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/927,803

(22) Filed: Oct. 30, 2015

(51) Int. Cl.
*H03L 7/02* (2006.01)
*H03K 3/0231* (2006.01)
*H03K 3/011* (2006.01)

(52) U.S. Cl.
CPC ............. *H03L 7/02* (2013.01); *H03K 3/011* (2013.01); *H03K 3/0231* (2013.01)

(58) Field of Classification Search
CPC ............ H03L 7/02; H03K 3/0231; H03K 4/50; H03K 4/501; H03K 4/502; H03K 3/011
See application file for complete search history.

(56) References Cited

U.S. PATENT DOCUMENTS

| 7,498,891 B2 * | 3/2009 | Manocha | G06F 1/04 331/14 |
| 9,234,936 B1 * | 1/2016 | Thakur | G01R 31/282 |
| 2013/0038364 A1 * | 2/2013 | Tokairin | H03K 4/502 327/156 |
| 2015/0349710 A1 * | 12/2015 | Wang | H03B 5/04 331/143 |

* cited by examiner

*Primary Examiner* — Ryan Johnson
(74) *Attorney, Agent, or Firm* — John R. Pessetto; Charles A. Brill; Frank D. Cimino

(57) ABSTRACT

A system for tuning an oscillator frequency. The system includes a trimmed calibration circuit comprising a comparator and trimmed delay element and calibration logic. The calibration logic is configured to receive an output of the comparator and control an on time and an off time of an oscillator based on the output of the comparator.

16 Claims, 4 Drawing Sheets

SYSTEMS AND METHODS FOR TUNING AN OSCILLATOR FREQUENCY

BACKGROUND

Various electronic devices rely on an oscillator to supply a clock signal, which is utilized by other components of the electronic device as is known in the art. Oscillators herein may be referred to as "external" or "internal." External oscillators utilize an on-board crystal oscillator external to, for example, a processor or microcontroller that relies on the clock signal generated by the external oscillator. External oscillators are fairly accurate; however, they are more expensive from both a cost and board area perspective. In particular, many applications exist that require a reasonably accurate precision clock signal but do not need or cannot tolerate the cost of an external crystal oscillator.

Internal oscillators, such as a relaxation oscillator, are integrated to a processor or microcontroller, and rely on an energy-storing element such as a capacitor and a nonlinear switching device (e.g., a latch or a comparator) connected in a feedback loop. The switching device periodically charges and discharges the energy stored in the storage element, thus causing changes in the output waveform. Internal oscillators are typically cheap; unfortunately, internal oscillators are far less accurate. Typical sources of error are introduced by the comparator, which can have a variable delay and/or offset. Often, correcting for one of the delay or offset negatively impacts the other.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . ." Also, the term "couple" or "couples" is intended to mean either an indirect or direct wired or wireless connection. Thus, if a first device couples to a second device, that connection may be through a direct connection or through an indirect connection via other devices and connections.

Figure 1:
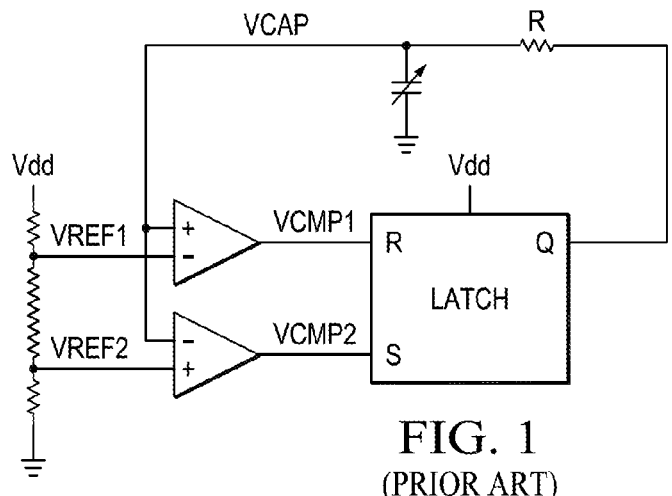
FIG. 1 shows a prior art relaxation oscillator.

FIG. 1 shows a conventional relaxation oscillator, which contains several shortfalls. First, the delay and offset of the comparators results in a significant impact on frequency accuracy of the oscillator as a result of process, voltage, and temperature (PVT) variation effects. Although the oscillator may be trimmed by selection of particular resistor and capacitor (RC) values, voltage and temperature variation still affect the comparator delay or offset, thus degrading accuracy significantly. Further, it is common to trim the R or C value with switches, which makes it difficult to trim the circuit with sufficient accuracy (e.g., as a result of parasitic components of the switch itself, which further vary with voltage and temperature). Thus, conventional trimming approaches introduce a significant additional supply and temperature dependency. These shortfalls of conventional oscillators result in an inability to achieve high accuracy with an internal oscillator, for example in scenarios where the cost of an external crystal oscillator is prohibitive.

To address these and other issues, examples of the present disclosure are directed to systems and methods for tuning an oscillator frequency. The disclosed examples result in internal oscillators that generate clock signals having frequency accuracies of +/−0.25% or better. In particular, calibration logic is leveraged to monitor an output of a trimmed calibration circuit and control an on time and an off time of an oscillator based on that output. The output of the trimmed calibration circuit may be generated by a comparator, for example, and it is possible to predict the frequency error based on this output and, as a result, apply a correction factor to the oscillator.

Figure 2:
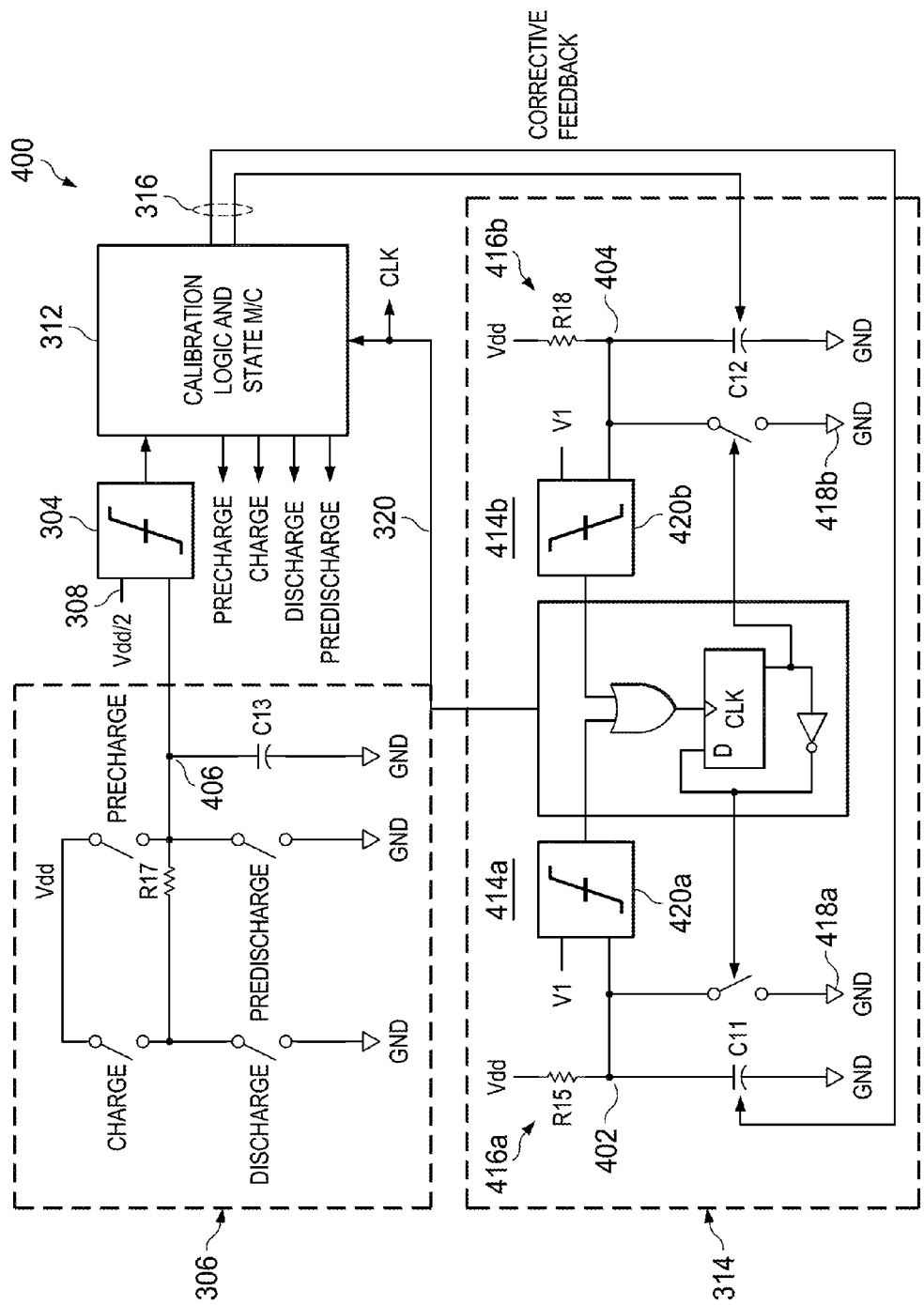
FIG. 2 shows an exemplary circuit implementation of a system for tuning an oscillator frequency in accordance with various examples

FIG. 2 illustrates an exemplary system 400 that leverages the fact that a greater comparator offset may be tolerated for a given frequency accuracy requirement where the clock period—rather than duty cycle—is utilized, which will be explained in further detail below. The structures shown in FIG. 2 should be understood to be exemplary, and one skilled in the art may implement various functionalities utilizing different particular circuit elements, substitutions, and the like. For example, a trimmed delay element 306 is shown as including various switches controlled by calibration logic 312 to control operation of charging and discharging cycles of the RC circuit of the trimmed delay element 306. Further, the oscillator 314 is shown as utilizing complimentary oscillators, where one oscillator 414a (the "left" oscillator for purposes of discussion) controls an on time of the clock signal 320 generated by the oscillator 314 and the other oscillator 414b (the "right" oscillator for purposes of discussion) controls an off time of the clock signal 320 generated by the oscillator 314. The oscillator 414a and 414b may be produced relatively inexpensively, and thus may be advantageously employed in examples of the present disclosure that address comparator offset and other inaccuracies, which will be described in further detail below. The two oscillators 414a and 414b are connected in a way such that together they create one final oscillator output 320 where "on" and "off" times are controlled individually by oscillator 414a and 414b, respectively.

The combined output clock 320 has an "off" phase that is proportional to the charging time of the node 406 associated with RC network 306 to Vdd/2 and an "on" phase that is proportional to the discharging time of the node 406 of the RC network 306 to Vdd/2. Thus, the period of the output tuned clock 320 is given by the sum of the "on" and "off" times of the clock 320. The waveform 220 shown in FIG. 3a, which will be explained in further detail below, illustrates this concept; that is, t1 corresponds to charging time and t2 corresponds to the discharging time, where the clock period is given by t1+t1.

Figure 4:
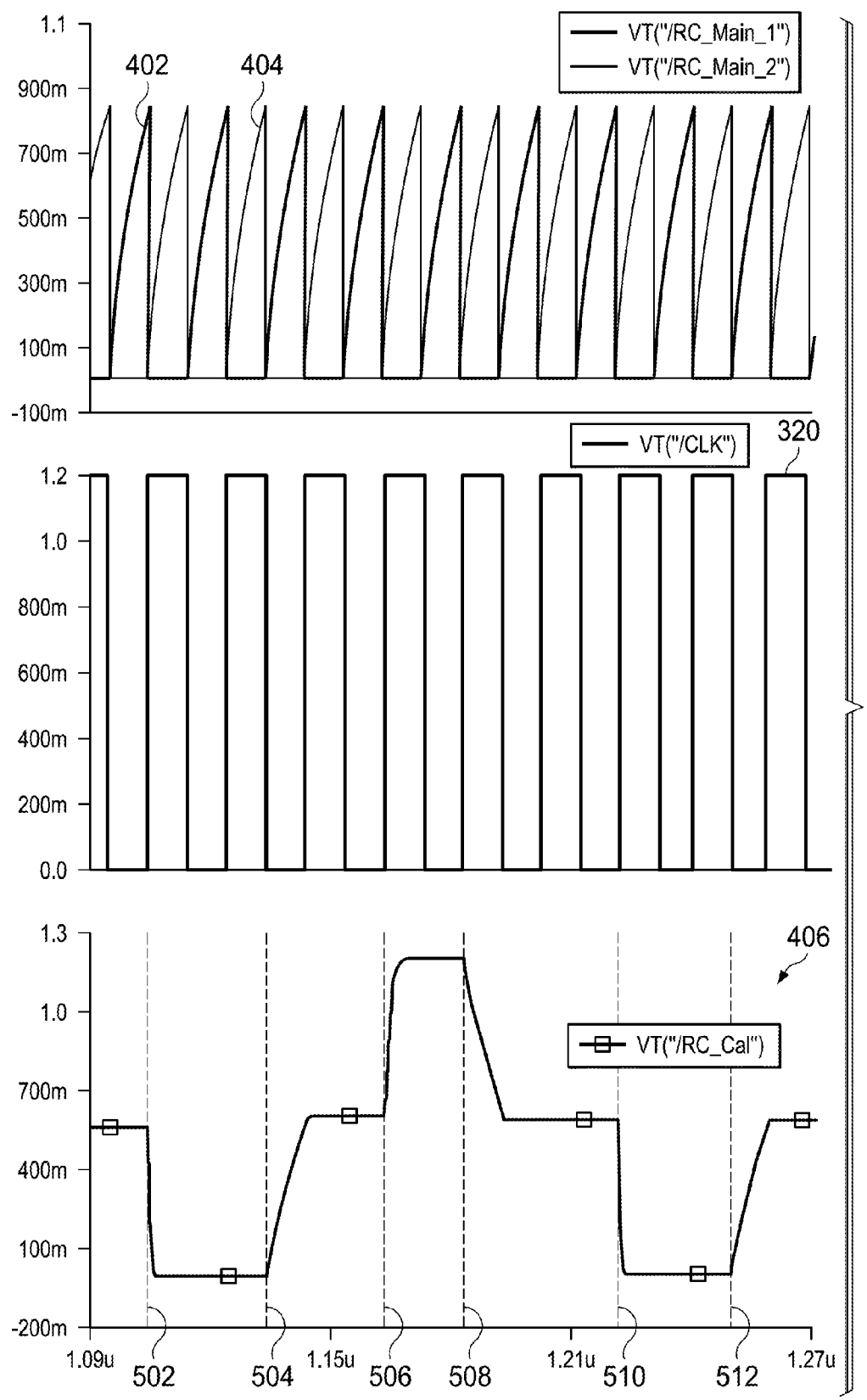
FIG. 4 shows voltage waveforms of various nodes within the exemplary system for tuning an oscillator frequency in accordance with various examples.

In discussing the example system 400, nodes 402 and 404 of the left and right oscillator 414, respectively, as well as the node 406 of the trimmed delay element 306, and the clock signal 320 are of particular importance. Voltage waveforms of these nodes 402, 404, 320, and 406 over time are shown in FIG. 4. Each of the oscillators 414 includes an RC circuit 416 and a switch 418 to reset the circuit output 402. Further, reference will be made to the waveforms shown in FIG. 4, which represent voltages of various nodes of the example system 400 as a function of time.

Figure 3A:
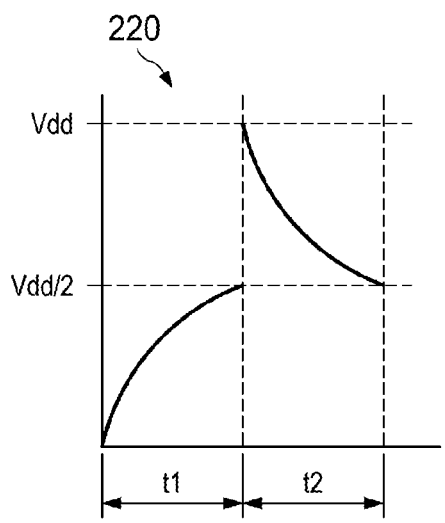
FIGS. 3a and 3b show exemplary voltage waveforms of charging from a reference voltage to a comparison voltage, potentially including a voltage offset, and discharging from a complimentary reference voltage to that same comparison voltage in accordance with various examples.

Turning to FIG. 3a, a graph 220 of the voltage at the node 406 of the RC circuit 306 is shown as a function of time. For the purposes of discussing the graph 220, it is assumed that reference voltage 308 is Vdd/2 for simplicity. The graph 220 illustrates an ideal situation in which no comparator 304 offset is present, and thus the comparator 304 triggers at the reference voltage 308 (Vdd/2). As a result, the time period t1 in which the trimmed RC circuit 306 charges node 406 from ground to the reference voltage 308 (Vdd/2) is equal to the time period t2 in which the RC circuit 306 discharges node 406 from the supply voltage (Vdd) to the reference voltage 308 (Vdd/2). In other words, the voltage being charged to in t1 is equivalent to the voltage being discharged from in t2.

Figure 3B:
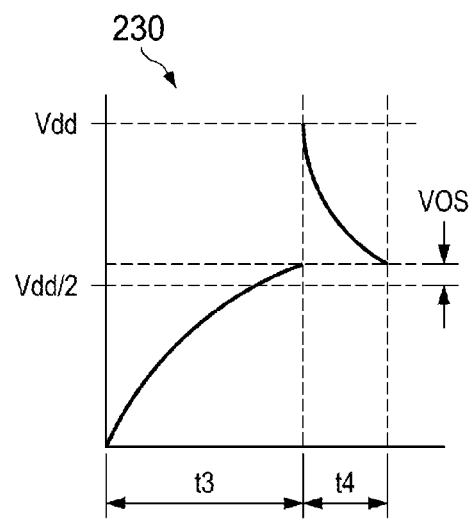

FIG. 3b illustrates a graph 230 in which the comparator 304 includes an offset given by Vos. The result of the voltage offset Vos is that the comparator 304 triggers at Vdd/2+Vos rather than Vdd/2. That is, the reference voltage 308 for which the RC circuit 306 was trimmed is not the voltage at which the comparator 304 actually triggers. As explained above, comparator 304 offset may be further altered during operation by changes in temperature or supply voltage. As a result of the increase in the voltage at which the comparator 304 triggers (i.e., Vdd/2+Vos), the time period t3 in which the RC circuit 306 charges node 406 from ground to the comparator trigger voltage (Vdd/2+Vos) increases and the time period t4 in which the RC circuit 306 discharges node 406 from the supply voltage (Vdd) to the comparator trigger voltage (Vdd/2+Vos) decreases. That is, the comparator 304 triggers earlier during discharging than it does during charging, as a result of the comparator 304 offset (Vos).

The following equations are presented to further explain the concept of tolerable frequency error in the system 400 and to demonstrate how examples of the present disclosure may be leveraged to reduce the frequency error to acceptable levels. Reference is made generally to FIGS. 2, 3a, and 3b, described above. First, assuming the RC circuit 306 charges from ground to voltage V1 (e.g., equal to Vdd/2) in time t1 and discharges from Vdd to V1 in time t2 as in FIG. 2a, the following equation represents the relation between V1, Vdd, t1, t2, and an RC constant of the RC circuit 206:

$$V_1 = V_{dd}\left(1 - e^{\frac{-t_1}{RC}}\right) = V_{dd} \times e^{\frac{-t_2}{RC}}$$

Assuming for the sake of simplicity and explanation that V1=Vdd/2, the above may be rewritten as:

$$t_1 = RC \times \log\left(\frac{V_{dd}}{V_{dd} - V_1}\right) = RC \times \log(2)$$

-continued $$t_2 = RC \times \log\left(\frac{V_{dd}}{V_1}\right) = RC \times \log(2)$$

Thus, as explained above, in the ideal case where no comparator 202 offset is present, it can be seen that t1 will equal t2. However, since some offset Vos is typically present, such influence must be considered. By rewriting the ratio of Vos/Vdd=α (i.e., a dimensionless value) and taking the above equations for t1 and t2 and replacing V1 with Vdd/2+Vos results in the following equations for t3 and t4:

$$t_3 = RC \times \log\left(\frac{V_{dd}}{V_{dd} - \left(\frac{V_{dd}}{2} + V_{os}\right)}\right) = RC \times \log\left(\frac{1}{0.5 - \alpha}\right)$$

$$t_4 = RC \times \log\left(\frac{V_{dd}}{\frac{V_{dd}}{2} - V_{os}}\right) = RC \times \log\left(\frac{1}{0.5 - \alpha}\right)$$

A total time ts, which is equal to t3+t4, is the value that is considered when determining frequency accuracy. That is, deviations in ts, which represents one clock cycle, from a value corresponding to the inverse of frequency, represent the error in frequency. Thus, given the above equations for t3 and t4, ts may be expressed as:

$$t_3 = RC \times \log\left(\frac{1}{0.5 - \alpha}\right) - RC \times \log\left(\frac{1}{0.5 - \alpha}\right) = RC \times \log\left(\frac{1}{0.25 - \alpha^2}\right)$$

For a tolerable accuracy of 0.25% or less, α is first set to zero in the above equation (i.e., no comparator offset is present) and the equation is multiplied by a factor of 1.0025, which is then set to be equal to the equation with no multiplier for error, but with α reintroduced, as follows:

$$RC \times \log\left(\frac{1}{0.25}\right) \times 1.0025 = RC \times \log\left(\frac{1}{0.25 - \alpha^2}\right)$$

Solving for α results in α=0.029, which, for a supply voltage 216 (Vdd) of 1.2V results in a tolerable comparator 304 offset (Vos) of approximately 35 mV. One aspect of the above is that the clock period is much more independent of comparator 202 offset than is the duty cycle.

Thus, examples of the present disclosure leverage the fact that although the presence of offset Vos may cause t3 to become longer and t4 to become shorter (in the case of a positive Vos), the sum of t3 and t4 remains relatively close to the ideal example of the sum of t1 and t2. In the above example, Vdd/2 was selected as the reference voltage 308 for simplicity of explanation; however, selecting Vdd/2 also represents the reference voltage 308 having a minimum sensitivity to the presence of voltage offset Vos. Other reference voltages 308 may be utilized instead, although with reduced tolerance to voltage offset Vos to maintain a given frequency accuracy. Further, it should be appreciated that the charging and discharging may occur in a more linear manner, in which case even error caused by very large offsets may be nullified since the increase in charge time will be directly related to the decrease in discharge time, or vice versa, resulting in an overall clock period that is equivalent to the ideal scenario illustrated by the graph 220.

Figure 5:
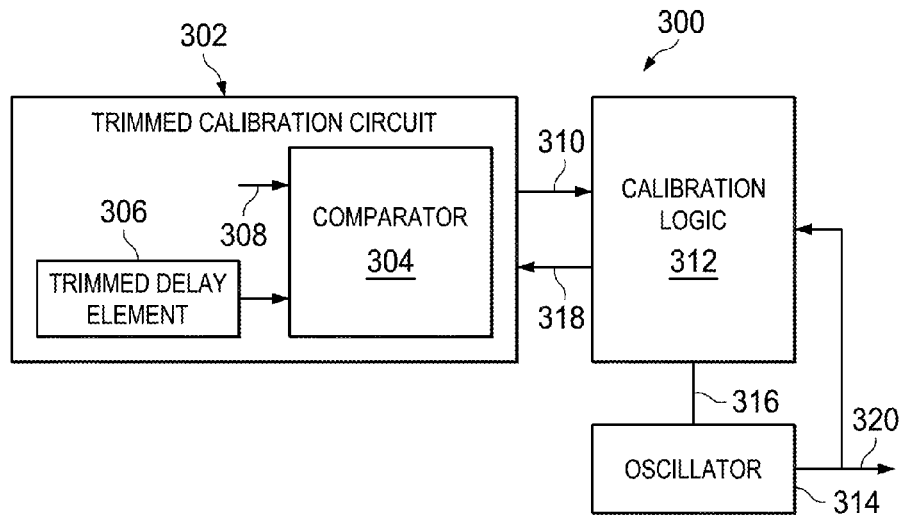
FIG. 5 shows a block diagram of a system for tuning an oscillator frequency in accordance with various examples.

FIG. 5 shows a more general implementation 300 of the system 400 of FIG. 2. The system 300 includes a trimmed calibration circuit 302 coupled to calibration logic 312. An oscillator 314 provides a clock signal 320 to the calibration logic 312 as well as other components of or coupled to the system 300.

The trimmed calibration circuit 302 includes a comparator 304 that receives as input a reference voltage 308 and an output from a trimmed delay element 306. The trimmed delay element 306, one example of which will be described in further detail referring back to FIG. 2, is designed to include a charge cycle and a discharge cycle that occur over a particular time period, and may be controlled by the calibration logic 312 by way of control signals 318. These may also be referred to as a precision charging cycle and a precision discharging cycle. That is, when the trimmed delay element 306 is active, it may occasionally carry out a precision charging cycle, which is known to take a certain period of time and may occasionally carry out a precision discharging cycle, which is likewise known to take a certain period of time. The output of the trimmed delay element 306 bears a relation to a source voltage Vdd and depends on the present cycle of operation of the trimmed delay element 306.

The comparator 304 compares the output of the trimmed delay element 306 to a reference voltage 308 and generates an output 310 that may be either high or low depending on the results of the comparison between the output of the trimmed delay element 306 and the reference voltage 308. The calibration logic 312 receives the output 310 and based on the output 310 relative to an expected output for the particular cycle of the trimmed delay element 306, adjusts the on time and the off time of the oscillator 314 by way of control signals 316.

Advantageously, in certain embodiments, the trimmed calibration circuit 302 or portions thereof may be powered down after a calibration of the oscillator 314 is performed. Subsequently, for example if the calibration logic 312 observes variations in the clock signal 320, temperature, and/or supply voltage, the trimmed calibration circuit 302 may be powered up and another round of calibration of the oscillator 314 is performed. In some cases, a predetermined threshold may be set for one or more of the clock signal 320, temperature, and supply voltage variations such that below the particular predetermined threshold of change, the trimmed calibration circuit 302 remains powered down, while above the particular predetermined threshold of change, the trimmed calibration circuit 302 is powered up.

Turning to the function of the trimmed calibration circuit 302, the calibration logic 312, and the oscillator 314, the waveform 406 of FIG. 4 represents the input to the comparator 304, which is compared in this example to Vdd/2. At 502, the calibration logic 312 closes the pre-discharge switch, rapidly pulling the node 406 to ground, which provides a known location (e.g., 0V) from which to begin charging, and a known time period that begins when charging begins from ground. The calibration logic 312 may wait for one or more cycles to give any transient noise at the node 406 ample time to settle, after which the calibration logic 312 triggers the start of a precision charging cycle 504, in this case aligned with a charging cycle of the left oscillator 414a, represented by the charging of the node 402.

When the comparator 420a of the left oscillator 414a triggers, this ends the off time of the clock signal 320 and begins the on time of the clock signal 320. The calibration logic 312 is aware of the change in the clock signal 320 by virtue of utilizing the clock signal 320 as an input. Thus, at this time (i.e., the end of the off time of the oscillator 314), if the output of the comparator 304 is high (e.g., input is higher than Vdd/2), then the precision charging cycle of the trimmed delay element 306 has occurred for longer than desired, indicating that the charge time of the node 402 is taking too long. In this event, the calibration logic 312 generates feedback to control or adjust the RC circuit 416a or the input voltage to the comparator 420a to reduce the charge time of the node 402. In other words, the calibration logic 312 decreases the off time of the oscillator 314.

Similarly, at the end of the off time of the oscillator 314, if the output of the comparator 304 is low (e.g., input is lower than Vdd/2), then the precision charging cycle of the trimmed delay element 306 has not yet completed during the charge time of the node 402, indicating that the charge time of the node 402 is occurring too quickly. In this event, the calibration logic 312 generates feedback to control or adjust the RC circuit 416a or the input voltage to the comparator 420a to increase the charge time of the node 402. In other words, the calibration logic 312 increases the off time of the oscillator 314.

After the precision charging cycle that began at 504 is complete and the off time of the oscillator 314 has been adjusted accordingly, the calibration logic 312 closes the pre-charge switch at 506. This pre-charge cycle rapidly pulls the node 406 to the supply voltage Vdd, which provides a known location (e.g., 1.2V) from which to begin discharging, and a known time period that begins when discharging begins. The calibration logic 312 may wait for one or more cycles to give any transient noise at the node 406 ample time to settle, after which the calibration logic 312 triggers the start of a precision discharging cycle 508, in this case aligned with a charging cycle of the right oscillator 414b, represented by the charging of the node 404.

When the comparator 420b of the right oscillator 414b triggers, this ends the on time of the clock signal 320 and begins the off time of the clock signal 320. The calibration logic 312 is aware of the change in the clock signal 320 by virtue of utilizing the clock signal 320 as an input. Thus, at this time (i.e., the end of the on time of the oscillator 314), if the output of the comparator 304 is high, then the precision discharging cycle of the trimmed delay element 306 has not yet completed during the charge time of the node 404, indicating that the charge time of the node 404 is occurring too quickly. In this event, the calibration logic 312 generates feedback to control or adjust the RC circuit 416b or the input voltage to the comparator 420b to increase the charge time of the node 404. In other words, the calibration logic 312 increases the on time of the oscillator 314.

Similarly, at the end of the on time of the oscillator 314, if the output of the comparator 304 is low (e.g., ground), then the precision discharging cycle of the trimmed delay element 306 has occurred in a greater amount of time than expected, indicating that the charge time of the node 404 is taking too long. In this event, the calibration logic 312 generates feedback to control or adjust the RC circuit 416b or the input voltage to the comparator 420b to decrease the charge time of the node 402. In other words, the calibration logic 312 decreases the on time of the oscillator 314.

At 510 and 512, the pre-discharge and precision charging processes begin again, and the example system 400 may continue in the above-described manner. As will be appreciated by one skilled in the art, in the above-described example, a "steady state" is not necessarily reached, since the calibration logic 312 continues to adjust the charge time of the nodes 402 and 404 depending on the output of the comparator 304. However, other embodiments may include additional circuitry to reach a steady state where the calibration logic 312 may include a state in which no adjustment of the on and/or off times of the oscillator 314 are carried out.

Further, in certain embodiments, the trimmed calibration circuit 302 or portions thereof (e.g., the trimmed delay element 306) may be powered down after a calibration of the oscillator 314 is performed. Subsequently, for example if the calibration logic 312 observes variations in the clock signal 320, temperature, and/or supply voltage, the trimmed calibration circuit 302 may be powered up and another round of calibration of the oscillator 314 is performed. In some cases, a predetermined threshold may be set for one or more of the clock signal 320, temperature, and supply voltage variations such that below the particular predetermined threshold of change, the trimmed calibration circuit 302 remains powered down, while above the particular predetermined threshold of change, the trimmed calibration circuit 302 is powered up.

As explained above, particularly with respect to FIGS. 2, 3a, and 3b, a reasonably high degree of frequency accuracy may be achieved where the error introduced by offset is related to the total clock period rather than each on time or off time relative to an ideal on time or off time of the clock. However, in accordance with various examples of the present disclosure, the trimmed calibration circuit 302 assesses the off time of the oscillator 314 from one reference point (e.g., charging from ground to Vdd/2 plus some comparator 304 offset Vos) and assesses the on time of the oscillator 314 from a complimentary reference point (e.g., discharging from Vdd to Vdd/2 plus the comparator 304 offset Vos). One example of a reference and a complimentary reference is, of course, ground and supply voltage respectively. However, the scope of the present disclosure need not be so limited. For example, in other cases where the system 300 receives a low voltage that is greater than ground, or where the system 300 receives a high voltage that is less than a supply voltage in a greater system context, these low and high voltages may serve as a reference and a complimentary reference in the sense that when charging from one and discharging from the other, the sum of voltage charged and voltage discharged is approximately equal to the difference between the complimentary reference and reference voltages and, in particular, is not generally dependent on any comparator offset Vos.

For sake of simplicity though, the following assumes that a true ground and true supply voltage are made available. Thus, by assessing on and off times from different, but complimentary reference points, the sum of the charge and discharge voltages will always be the supply voltage Vdd regardless of comparator 304 offset Vos, and thus the period of clock signal 320 remains relatively constant even in the presence of varying comparator 304 offset Vos, resulting a high accuracy, but inexpensive and low power internal oscillator solution. Further, it is again noted that although FIG. 2 was explained with the oscillator 314 comprising two oscillators 414, one of each being responsible for the off and on times of the oscillator 314, such an implementation is not necessary. Indeed, a single oscillator may be utilized where associated on and off times may be varied.

The examples of the present disclosure explained above present numerous advantages relative to conventional internal oscillators. For example, conventionally at least one precision analog component is required, such as a low-offset comparator. However, examples of the present disclosure greatly mitigate the effects of comparator offset as set forth above. Further, the reduced reliance on a low-offset comparator enabled by the described examples means that comparators employed in these examples may be very low power, which further reduces power consumption of the disclosed internal oscillator structures, even in an always on configuration.

Figure 6:
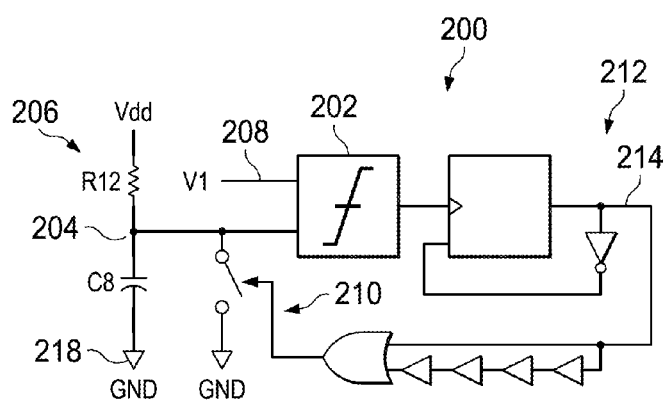
FIG. 6 shows a circuit diagram of an exemplary oscillator in accordance with various examples.

For exemplary purposes, FIG. 6 illustrates one possible oscillator 200 structure for purposes of reiterating the issues caused by comparator offset, among other issues addressed by examples of the present disclosure. The oscillator 200 may be produced relatively inexpensively, and thus may be advantageously employed in examples of the present disclosure that address offset and other inaccuracies, which will be described in further detail below. The oscillator 200 includes a comparator 202, which compares a node 204 of an RC circuit 206 to a reference voltage 208, shown here as V1. Although the comparator 202 is shown as having a reference voltage 208 of V1, the value of V1 is not of particular relevance since the RC circuit 206 may be trimmed at the factory to take the particular value of V1 into account. Regardless of this, the comparator 202 may have an offset that creates an error from V1 altering the voltage at which the comparator triggers. The remaining portion 212 of the oscillator 200 creates a clock signal 214 that changes based on the comparator output. The delay and offset of the comparator 202 have a direct and strong impact on a frequency of the oscillator 200. These delay and offset errors are not only process dependent, which can be corrected by a one-time trimming procedure, but also have strong voltage and temperature dependencies, which are corrected as explained above.

Figure 7:
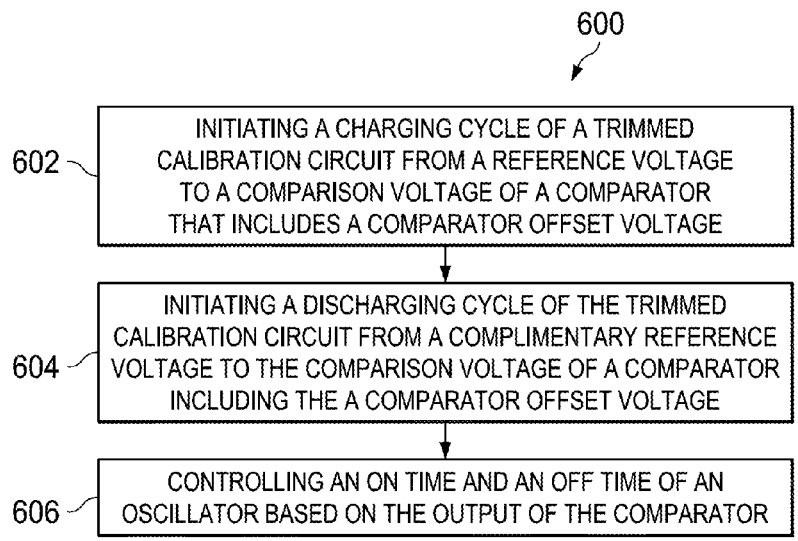
FIG. 7 shows a flow chart of a method in accordance with various examples.

Turning now to FIG. 7, a method 600 for tuning an oscillator is shown in accordance with various examples of the present disclosure. The method 600 begins in block 602 with initiating a charging cycle of a trimmed calibration circuit from a reference voltage to a comparison voltage of a comparator that includes a comparator offset voltage. In block 604, the method 600 continues with initiating a discharging cycle of the trimmed calibration circuit from a complimentary reference voltage to the comparison voltage of the comparator including the comparator offset voltage.

As explained, a reasonably high degree of frequency accuracy may be achieved where the error introduced by offset is related to the total clock period rather than each on time or off time relative to an ideal on time or off time of the clock. Thus, the method 600 leverages a charging time based on one reference point (e.g., charging from ground to Vdd/2 plus some comparator 304 offset Vos) and a discharging time based on a complimentary reference point (e.g., discharging from Vdd to Vdd/2 plus the comparator 304 offset Vos).

The method 600 continues in block 606 with controlling an on time and an off time of an oscillator based on the output of the comparator. This results in reducing the effect of comparator offset on overall frequency (i.e., the inverse of the sum of on and off times) accuracy, since the sum of charge and discharge times remains largely unchanged where the sum of the charge and discharge voltages remains approximately constant, as demonstrated above.

The above discussion is meant to be illustrative of the principles and various examples of the present invention. Numerous variations and modifications will become apparent to those skilled in the art once the above disclosure is fully appreciated. It is intended that the following claims be interpreted to embrace all such variations and modifications.

What is claimed is:

1. A system for tuning an oscillator frequency, comprising:
   a trimmed calibration circuit comprising a comparator and trimmed delay element; and
   calibration logic configured to:
      receive an output of the comparator; and
      control an on time and an off time of an oscillator based on the output of the comparator;
   wherein the calibration logic is further configured to:
   receive a clock signal from the oscillator comprising the on time and off time of the oscillator;
   monitor the output of the comparator during a charging cycle of the trimmed calibration circuit and:
      decrease the off time of the oscillator as a result of the comparator output being high at an end of the off time of the oscillator; or
      increase the off time of the oscillator as a result of the comparator output being low at the end of the off time of the oscillator; and
   monitor the output of the comparator during a discharging cycle of the trimmed calibration circuit and:
      increase the on time of the oscillator as a result of the comparator output being high an end of the on time period of the oscillator; or
      decrease the on time of the oscillator as a result of the comparator output being low at the end of the on time period of the oscillator.

2. The system of claim 1 wherein:
   the charging cycle of the trimmed calibration circuit is from a reference voltage to a comparison voltage of the comparator that includes a comparator offset voltage; and
   the discharging cycle of the trimmed calibration circuit is from a complimentary reference voltage to the comparison voltage of the comparator including the comparator offset voltage.

3. The system of claim 2 wherein the reference voltage comprises a ground voltage and the complimentary reference voltage comprises a supply voltage.

4. A system for tuning an oscillator frequency, comprising:
   a trimmed calibration circuit comprising a comparator and trimmed delay element; and
   calibration logic configured to:
      receive an output of the comparator; and
   control an on time and an off time of an oscillator based on the output of the comparator;
      wherein the calibration logic is further configured to power down the trimmed calibration circuit as a result of the on and off times of the oscillator reaching a predetermined level of calibration;
      wherein the calibration logic is further configured to power up the trimmed calibration circuit in response to the on or off time of the oscillator deviating from the predetermined level of calibration.

5. A system for tuning an oscillator frequency, comprising:
   a trimmed calibration circuit comprising a comparator and trimmed delay element; and
   calibration logic configured to:
      receive an output of the comparator; and
   control an on time and an off time of an oscillator based on the output of the comparator;
      wherein the calibration logic is further configured to power down the trimmed calibration circuit as a result of the on and off times of the oscillator reaching a predetermined level of calibration;
      wherein the calibration logic is further configured to power up the trimmed calibration circuit in response to an indication of a change in temperature above a predetermined threshold.

6. A system for tuning an oscillator frequency, comprising:
   a trimmed calibration circuit comprising a comparator and trimmed delay element; and
   calibration logic configured to:
      receive an output of the comparator; and
   control an on time and an off time of an oscillator based on the output of the comparator;
      wherein the calibration logic is further configured to power down the trimmed calibration circuit as a result of the on and off times of the oscillator reaching a predetermined level of calibration;
      wherein the calibration logic is further configured to power up the trimmed calibration circuit in response to an indication of a change in supply voltage above a predetermined threshold.

7. A system for tuning an oscillator frequency, comprising:
   a trimmed calibration circuit comprising a comparator and a trimmed delay element; and
   calibration logic configured to:
      receive an output of the comparator; and
      control an on time and an off time of an oscillator based on the output of the comparator;
      wherein a charging cycle of the trimmed calibration circuit is from a reference voltage to a comparison voltage of the comparator that includes a comparator offset voltage; and
      wherein a discharging cycle of the trimmed calibration circuit is from a complimentary reference voltage to the comparison voltage of the comparator including the comparator offset voltage.

8. The system of claim 7 wherein the calibration logic is further configured to:
   receive a clock signal from the oscillator comprising the on time and off time of the oscillator;
   monitor the output of the comparator during the charging cycle of the trimmed calibration circuit and:
      decrease the off time of the oscillator as a result of the comparator output being high at an end of the off time of the oscillator; or
      increase the off time of the oscillator as a result of the comparator output being low at the end of the off time of the oscillator; and
   monitor the output of the comparator during the discharging cycle of the trimmed calibration circuit and:
      increase the on time of the oscillator as a result of the comparator output being high an end of the on time period of the oscillator; or
      decrease the on time of the oscillator as a result of the comparator output being low at the end of the on time period of the oscillator.

9. The system of claim 7 wherein the reference voltage comprises a ground voltage and the complimentary reference voltage comprises a supply voltage.

10. The system of claim 7 wherein the calibration logic is configured to control the on and off times of the oscillator through adjustment of an RC time constant or a comparison voltage of the oscillator.

11. The system of claim 7 wherein the calibration logic is further configured to power down the trimmed calibration circuit as a result of the on and off times of the oscillator reaching a predetermined level of calibration.

12. The system of claim 7 wherein the calibration logic is further configured to power up the trimmed calibration circuit in response to the on or off time of the oscillator deviating from the predetermined level of calibration.

13. The system of claim 7 wherein the calibration logic is further configured to power up the trimmed calibration circuit in response to an indication of a change in temperature or a change in supply voltage above a predetermined threshold.

14. A method for tuning an oscillator frequency, comprising:
 initiating a charging cycle of a trimmed calibration circuit from a reference voltage to a comparison voltage of a comparator that includes a comparator offset voltage;
 initiating a discharging cycle of the trimmed calibration circuit from a complimentary reference voltage to the comparison voltage of the comparator including the comparator offset voltage;
 controlling an on time and an off time of an oscillator based on the output of the comparator.

15. The method of claim 14 further comprising:
 receiving a clock signal from the oscillator comprising the on time and off time of the oscillator;
 monitoring the output of the comparator during the charging cycle of the trimmed calibration circuit and:
  decreasing the off time of the oscillator as a result of the comparator output being high at an end of the off time of the oscillator; or
  increasing the off time of the oscillator as a result of the comparator output being low at the end of the off time of the oscillator; and
 monitoring the output of the comparator during the discharging cycle of the trimmed calibration circuit and:
  increasing the on time of the oscillator as a result of the comparator output being high an end of the on time period of the oscillator; or
  decreasing the on time of the oscillator as a result of the comparator output being low at the end of the on time period of the oscillator.

16. The method of claim 14 further comprising powering down the trimmed calibration circuit as a result of the on and off times of the oscillator reaching a predetermined level of calibration.

* * * * *